Sept. 9, 1969 J. W. CONLEY 3,465,417
ALLOY-JUNCTION AND METAL-SEMICONDUCTOR DIODE FABRICATION METHOD
Filed Dec. 27, 1966
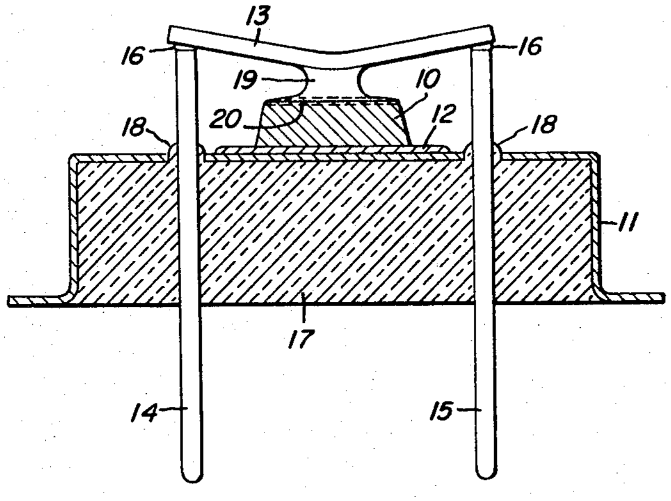
Inventor:
James W. Conley,
by Marvin Snyder
His Attorney.

United States Patent Office 3,465,417
Patented Sept. 9, 1969

3,465,417

ALLOY-JUNCTION AND METAL-SEMICONDUCTOR DIODE FABRICATION METHOD

James W. Conley, Scotia, N.Y., assignor to General Electric Company, a corporation of New York Filed Dec. 27, 1966, Ser. No. 604,845
Int. Cl. B23k *31/02, 35/36, 35/12*
U.S. Cl. 29—473.1 11 Claims

ABSTRACT OF THE DISCLOSURE

A method of forming metal-semiconductor diodes by fusing indium to germanium by soaking for about one minute in a heated bath containing a fluxing reagent. The bath comprises a solution of ethylene glycol containing a saturating amount of ammonium chloride, and is maintained at a constant temperature of between 155°–170° C. Because operation of the process at this temperature range sufficiently minimizes the width of the regrown indium-germanium region, diodes thus formed are of the Schottky barrier type.

Background of the invention

This invention relates to a method of fabricating semiconductive devices, and more particularly to a method of fabricating improved semiconductor devices of the type having rectifying alloy-functions of the p-n type or metal-semiconductor junctions of the Schottky barrier type.

Alloy-junction semiconductor devices comprising a metal fused to a semiconductor are well-known in the semiconductor art. In fabricating such devices, electrical operating characteristics are greatly improved if uniform wetting of the semiconductor by the metal can be achieved. For example, current-carrying capacity of the device is improved because of the greater area of contact achieved between the semiconductor and the metal when the metal uniformly wets the semiconductor. Heretofore, techniques employed for improving metal-to-semiconductor contacts have included gaseous hydrogen fluxing at relatively high temperatures, as well as various soldering techniques using applied fluxes.

The process of the instant invention requires only a flux bath operated at or above the melting temperature of the metal or, in some instances, at or above the metal-semiconductor eutectic temperature, in order to achieve uniform wetting of the semiconductor by the metal, thereby eliminating complex soldering steps and yet avoiding the safety hazards accompanying use of hydrogen. By this method, the process may be practiced at relatively low temperatures.

A feature sought to be obtained in fabricating metal-semiconductor devices is minimal regrowth of the binary solution, thereby achieving the condition necessary for high frequency response; that is, that the p-type region be sufficiently narrow so that the depletion layer width extends over the entire p-type region and thereby injects no minority carriers under forward bias conditions. By fusing the metal to the semiconductor in a flux bath heated minimally above the melting temperature of the metal or the eutechtic temperature of the metal-semiconductor eutectic, regrowth of the binary metal-semiconductor solution can be readily minimized. Devices formed in this manner are known as Schottky barrier diodes.

A feature sought to be obtained in fabricating alloy junction semiconductor devices is controlled regrowth of the binary solution to produce a narrow region of controlled properties. The metal may contain added impurities, if desired, such as gallium or antimony which produce p- or n-type regions, respectively, in the semiconductor. Further, the controlled region may be diluted of impurities originally present in the semiconductor, thereby producing a nearly intrinsic region. This results in a device structure which formerly could be produced only by epitaxial crystal growth, but with advantages inherent to the lower processing temperature afforded by the instant invention. These advantages, which also accrue to metal-semiconductor diodes fabricated in accordance with the process herein described, include the fact that impurities such as copper display very little tendency to diffuse into the semiconductor at the lower processing temperature, thereby sharply reducing semiconductor contamination problems.

Summary of invention

One object of this invention is to provide a simple method of fabricating high frequency metal-semiconductor devices.

Another object is to provide a method of producing electronic components having narrow regions of binary regrowth which have controlled impurities.

Another object is to provide a safe, rapid method of uniformly alloying a metal to a semiconductor.

Briefly, in accordance with a preferred embodiment of the invention, there is provided a method of forming rectifying junctions by joining a metal to a semiconductor comprising the steps of contacting the semiconductor with the metal, soaking the semiconductor and the metal in a heated bath and maintaining the temperature of the bath at or above the melting point of the metal. In another embodiment, the temperature of the bath is maintained at or above the eutectic temperature of the metal-semiconductor.

Brief description of the drawing

The features of the invention believed to be novel are set forth with particularity in the appended claims. The invention itself, however, both as to organization and method of operation, together with further objects and advantages thereof, may best be understood by reference to the following description taken in conjunction with the accompanying drawing in which:

The single figure is a sectional view of a diode fabricated in accordance with the process of the instant invention.

Description of the preferred embodiments

In practicing the technique of the instant invention, an n-type germanium wafer or die 10 is bonded to a standard header 11 such as the type bearing the Joint Electronic Devices Engineering Council (JEDEC) designation T0–18. The n-type germanium wafer preferably comprises germanium doped with arsenic in a conventional manner. The wafer to be used for this purpose may be fabricated by lapping the n-type geranium to .007″ with a 5 micron final finish and thereafter scribing the germanium into .03″ by .03″ square dies.

The device is assembled by first plating a 0.2 mil gold-antimony platform 12 onto the upper portion of header 11 in a conventional manner. The lapped die is then eutectic bonded in conventional fashion to the gold-antimony layer 12. A nickel wire 13, preferably .005″ in diameter, is soldered to conductive pins or leads 14 and 15 by use of common lead-tin solder 16. Pins 14 and 15 are insulated from each other by insulating layer 17 and by insulating seals 18, all of which may typically be formed of glass.

The die is thereafter subjected to an electrolytic etch in order to remove rough damage. This is accomplished by etching for about 60 seconds in a solution of three parts water and one part 50% solution of sodium hydroxide while a current of 100 microamps is passed through the structure. The die is thereafter polished in a mixture of 3 parts nitric acid and one part hydrofluoric acid for 15 seconds, in order to chemically brighten the surface.

Next, a sphere of metal which is preferably approximately 0.01" in diameter, is wedged between nickel wire 13 and die 10. Typically, the metal sphere is comprised of indium. The indium is then fused in heated ethylene glycol to which a saturating amount of ammonium chloride has been added by soaking for about one minute. The temperature of this bath is maintained at a constant level in the range of 155°–170° C., with a typical bath temperature being 165° C. The softened indium thus assumes a shape indicated at 19, whereby it thoroughly wets germanium die 10 as well as nickel wire 13.

In the fusing bath, stearic acid may be substituted for the ethylene glycol to achieve the same results, with the temperature and time of the reaction remaining unchanged. Either bath is satisfactory; however, in ethylene glycol the ammonium chloride is essential for its fluxing action which aids in promoting uniform alloying.

For the metal, tin may be substituted for the indium. In such instance, the temperature of the bath, which in this case is preferably stearic acid, is maintained between 231°–246° C., with 245° C. being typical. The soaking period typically is about one minute, although this may be varied by as much as 50 percent in order to control the reducing action of the bath.

It is also possible to substitute lead for the indium. Here again, the bath is preferably stearic acid, heated to a temperature at, or slightly above, 321° C., with a typical soaking period of about one minute.

By employing the process of the instant invention, the necessity of either alloying by use of hydrogen as a flux, or utilizing any of various soldering techniques which require applied fluxes, is obviated. Moreover, not only does this process achieve uniform wetting of the semiconductor by the metal, but also there is only minimal regrowth of the binary metal-germanium solution upon cooling. In addition, because temperatures employed in the fusing bath can be maintained very close to the metal-germanium eutectic, formation of a junction of the type commonly known as the Schottky barrier, results. This junction between the metal and the semiconductor is indicated generally at 20.

Junction diodes formulated in the foregoing fashion, wherein, for example, the n-type semiconductor comprises germanium wafer 10 and the p-type semiconductor comprises the very narrow regrown indium-germanium alloy region, are ideally suited to high frequency operation by virtue of the narrow, sharp p-n junction. Moreover, the small size of the regrown indium-germanium region results in a depletion layer which, under reverse bias conditions, extends throughout the entire p-type region. This is a well-known prerequisite for various electromagnetic radiation detectors of the semiconductor type, and hence this device finds utility in such applications.

In order to form an alloy junction in accordance with this process, the same steps are employed. However, the temperature of the fusing bath, which may range from about 15° C. above the metal-semiconductor eutectic up to the boiling point of the bath, typically is elevated by about 20° C. above the temperature normally employed in fabricating the metal-semiconductor junctions. For example, in joining indium to germanium, a typical bath temperature would be about 185° C., while in joining tin to germanium, a typical bath temperature would be about 265° C. A typical bath temperature in joining lead to germanium would be about 341° C.

The foregoing describes a simple method of fabricating alloy-junction diode devices or high frequency diode devices having abrupt metal-semiconductor barriers by maintaining the regrown region at a minimal size. The process is employed at temperatures lower than heretofore deemed possible, thereby minimizing safety hazards without sacrificing rapidity of fabrication.

While only certain preferred features of the invention have been shown by way of illustration, many modifications and changes will occur to those skilled in the art. It is, therefore, to be understood that the appended claims are intended to cover all such modifications and changes as fall within the true spirit and scope of the invention.

What I claim as new and desire to secure by Letters Patent of the United States is:

1. A method of forming abrupt metal-to-semiconductor junctions comprising the steps of: contacting said semiconductor with said metal; soaking said semiconductor and said metal in a heated bath; and maintaining the temperature of said bath between the eutectic temperature of said metal and said semiconductor and 15° C. above said eutectic temperature for sufficient time to fuse said metal to said semiconductor.

2. The method of forming abrupt metal-to-semiconductor junctions of claim 1 wherein said bath includes a fluxing reagent.

3. The method of forming abrupt metal-to-semiconductor junctions of claim 1 wherein said metal comprises indium, said semiconductor comprises germanium, and said heated bath comprises ethylene glycol containing a fluxing reagent.

4. The method of forming abrupt metal-to-semiconductor junctions of claim 3 wherein said fluxing reagent comprises ammonium chloride.

5. The method of forming abrupt metal-to-semiconductor junctions of claim 1 wherein said metal comprises one of the group consisting of indium, tin and lead, said semiconductor comprises germanium, and said bath comprises stearic acid.

6. A method of forming alloy junctions by joining a metal to a semiconductor comprising the steps of: contacting said semiconductor with said metal; soaking said semiconductor and said metal in a bath containing a fluxing reagent; and maintaining the temperature of said bath at approximately 20° C. to 35° C. above the eutectic temperature of said metal and said semiconductor for sufficient time to alloy said metal with said semiconductor.

7. The method of forming alloy junctions of claim 6 wherein said bath includes a fluxing reagent.

8. The method of forming alloy junctions of claim 6 wherein said metal comprises indium, said semiconductor comprises germanium, and said heated bath comprises ethylene glycol containing a fluxing reagent.

9. The method of forming alloy junctions of claim 8 wherein said fluxing reagent comprises ammonium chloride.

10. The method of forming alloy junctions of claim 6 wherein said metal comprises indium, said semiconductor comprises germanium, and said bath comprises stearic acid.

11. A method of forming rectifying junctions by joining a metal to a semiconductor comprising the steps of: contacting said semiconductor with said metal; soaking said semiconductor and said metal in a heated bath; and maintaining the temperature of said bath at a substantially constant level between the eutectic temperature of said metal and said semiconductor and the boiling point of said bath for sufficient time to fuse said metal to said semiconductor through a predetermined depth.

References Cited

UNITED STATES PATENTS

| | | | |
|---|---|---|---|
| 2,842,841 | 7/1958 | Schnable et al. | 29—495 |
| 3,054,174 | 9/1962 | Rose et al. | 29—495 X |
| 3,110,100 | 11/1963 | Hill | 29—495 X |

JOHN F. CAMPBELL, Primary Examiner

J. L. CLINE, Assistant Examiner

U.S. Cl. X.R.

29—495, 498, 501